US010617014B2

(12) United States Patent
Kuczynski et al.

(10) Patent No.: US 10,617,014 B2
(45) Date of Patent: Apr. 7, 2020

(54) VIA STUB ELIMINATION BY DISRUPTING PLATING

(71) Applicant: International Business Machines Corporation, Armonk, NY (US)

(72) Inventors: Joseph Kuczynski, North Port, FL (US); Bruce Chamberlin, Vestal, NY (US); Scott B. King, Rochester, MN (US); Matthew Kelly, Oakville (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/273,957

(22) Filed: Feb. 12, 2019

(65) Prior Publication Data

US 2019/0182968 A1    Jun. 13, 2019

Related U.S. Application Data

(62) Division of application No. 15/823,025, filed on Nov. 27, 2017, now Pat. No. 10,212,828.

(51) Int. Cl.
| | | |
|---|---|---|
| *H05K 1/02* | (2006.01) | |
| *H05K 1/03* | (2006.01) | |
| *H05K 1/05* | (2006.01) | |
| *H05K 1/11* | (2006.01) | |
| *H05K 3/20* | (2006.01) | |

(Continued)

(52) U.S. Cl.
CPC ............ *H05K 3/422* (2013.01); *H05K 1/0251* (2013.01); *H05K 1/115* (2013.01); *H05K 3/429* (2013.01); *H05K 3/4611* (2013.01); *H05K 2201/095* (2013.01)

(58) Field of Classification Search
CPC .. H05K 1/02; H05K 1/03; H05K 1/05; H05K 1/11; H05K 1/115; H05K 3/20; H05K 3/42
USPC .......... 174/262, 255, 264, 266; 29/745, 825, 29/837, 852; 1/1
See application file for complete search history.

(56) References Cited

U.S. PATENT DOCUMENTS

| | | |
|---|---|---|
| 5,439,711 A | 8/1995 | Vu et al. |
| 7,964,289 B2 | 6/2011 | Takai et al. |
| 8,528,203 B2 | 9/2013 | Balcome et al. |

(Continued)

OTHER PUBLICATIONS

Anonymous, "Two-Photon Resist Process to Fabricate Stubless Vias," An IP.com Prior Art Database Technical Disclosure, IP.com No. IPCOM000216369D, IP.com Electronic Publication Date: Apr. 2, 2012, 3 pgs.

(Continued)

*Primary Examiner* — Xiaoliang Chen
(74) *Attorney, Agent, or Firm* — Jared L. Montanaro

(57) ABSTRACT

A PWB may be drilled forming a via. The via may expose one or more internal portions of a core layer, a prepreg layer, and an anti-plate coating. A seed material may then be applied from a top portion of the PWB to the via, forming a seed layer in the via, the seed material not adhering to the anti-plate coating. Electroless metal may then be applied from the top portion of the PWB to the via, forming an electroless plate layer that adheres to the seed layer. Electrolytic copper may then be applied from the top portion of the PWB to the via, forming a copper layer that adheres to the electroless plate layer. A bottom portion of the electroless plate layer may then be removed.

11 Claims, 6 Drawing Sheets

(51) Int. Cl.
*H05K 3/42* (2006.01)
*H05K 3/46* (2006.01)

(56) References Cited

U.S. PATENT DOCUMENTS

| | | | |
|---|---|---|---|
| 8,667,675 B2* | 3/2014 | Dudnikov, Jr. | H05K 1/0257 |
| | | | 174/259 |
| 9,816,663 B2 | 11/2017 | Bally | |
| 10,212,828 B1 | 2/2019 | Kuczynski et al. | |
| 2002/0109283 A1 | 8/2002 | Hasegawa et al. | |
| 2002/0195716 A1 | 12/2002 | Magnuson et al. | |
| 2003/0158301 A1 | 8/2003 | Harashina et al. | |
| 2005/0048770 A1 | 3/2005 | Mashino | |
| 2008/0145689 A1 | 6/2008 | Ogawa et al. | |
| 2008/0301934 A1* | 12/2008 | Dudnikov, Jr. | H05K 1/0257 |
| | | | 29/837 |
| 2010/0112480 A1 | 5/2010 | Hirose et al. | |
| 2010/0325911 A1 | 12/2010 | Alisch et al. | |
| 2012/0211273 A1 | 8/2012 | Kuczynski et al. | |
| 2012/0234587 A1* | 9/2012 | Nakamura | H05K 1/115 |
| | | | 174/260 |
| 2012/0312589 A1* | 12/2012 | Balcome | H05K 3/429 |
| | | | 174/258 |
| 2014/0027163 A1 | 1/2014 | Min et al. | |
| 2014/0190733 A1* | 7/2014 | Dudnikov, Jr. | H05K 3/429 |
| | | | 174/264 |
| 2014/0251663 A1* | 9/2014 | Iketani | H05K 1/115 |
| | | | 174/255 |
| 2014/0262455 A1* | 9/2014 | Iketani | H05K 3/429 |
| | | | 174/255 |
| 2014/0345916 A1 | 11/2014 | Park et al. | |
| 2015/0047188 A1 | 2/2015 | Thomas et al. | |
| 2015/0216606 A1 | 8/2015 | Bally et al. | |
| 2016/0021762 A1* | 1/2016 | Kallman | H05K 3/429 |
| | | | 174/266 |
| 2016/0024293 A1 | 1/2016 | Nestle et al. | |
| 2016/0029488 A1 | 1/2016 | Kang et al. | |
| 2016/0153611 A1 | 6/2016 | Bally | |
| 2016/0278207 A1* | 9/2016 | Pen | H05K 1/115 |
| 2016/0278208 A1* | 9/2016 | Pen | H05K 1/115 |
| 2016/0360624 A1* | 12/2016 | Kuwako | H05K 3/022 |
| 2017/0318685 A1 | 11/2017 | Chen et al. | |
| 2018/0092222 A1* | 3/2018 | Iketani | H05K 3/429 |
| 2018/0098426 A1* | 4/2018 | Iketani | H05K 1/115 |
| 2018/0332719 A1 | 11/2018 | Doyle et al. | |

OTHER PUBLICATIONS

Carver et al., "PWB Z interconnect technology—Electrical performance," IMAPS 2014 Proceedings; Oct. 13-16, 2014, pp. 217-221.
Egitto et al., "Z-Axis Interconnection for Enhanced Wiring in Organic Laminate Electronic Packages," Proceedings Electronic Components and Technology, 2005. ECTC '05, pp. 1132-1138.
Kuczynski et al., "Via Stub Elimination by Disrupting Plating," U.S. Appl. No. 16/273,923, filed Feb. 12, 2019.
List of IBM Patents or Patent Applications Treated as Related, Feb. 12, 2019, 2 pgs.

\* cited by examiner

VIA STUB ELIMINATION BY DISRUPTING PLATING

BACKGROUND

The present disclosure relates generally to the field of printed wiring boards (PWB), and more specifically to eliminating via stubs in plated through holes by disrupting plating using personalized cores.

Many PWBs are formed by stacking multiple conductive sheets between non-conductive substrates and laminating the stack. PWBs mechanically support and electrically connect electronic components etched from the conductive sheets. Conductive sheets on different layers are interconnected with plated-through holes called vias. Typically, a via contains a via stub that is only connected to one conductive sheet, and does not complete a circuit. Via stubs can significantly distort digital signals passing through a via.

SUMMARY

Embodiments of the present disclosure include a method for forming a stubless via in a printed wiring board (PWB). A hole may be drilled into a PWB to form a via. The via may expose one or more internal portions of a core layer, a prepreg layer, and an anti-plate coating. A seed material may then be applied from a top portion of the PWB to the via, forming a seed layer in the via, the seed material not adhering to the anti-plate coating. Electroless metal may then be applied from the top portion of the PWB to the via, forming an electroless plate layer that adheres to the seed layer. Electrolytic copper may then be applied from the top portion of the PWB to the via, forming a copper layer that adheres to the electroless plate layer. A bottom portion of the electroless plate layer may then be removed.

Other embodiments of the present disclosure include a stubless via structure in a PWB. The stubless via may include one or more core layers. At least one of the core layers is circuitized with a copper trace. The stubless via may additionally include one or more prepreg layers. The prepreg layers alternatively stack between the core layers. The stubless via may additionally include a via that is drilled through each of the alternatively stacked prepreg layers and core layers. The drilling of the via exposes internal portions of each of the prepreg layers and core layers.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
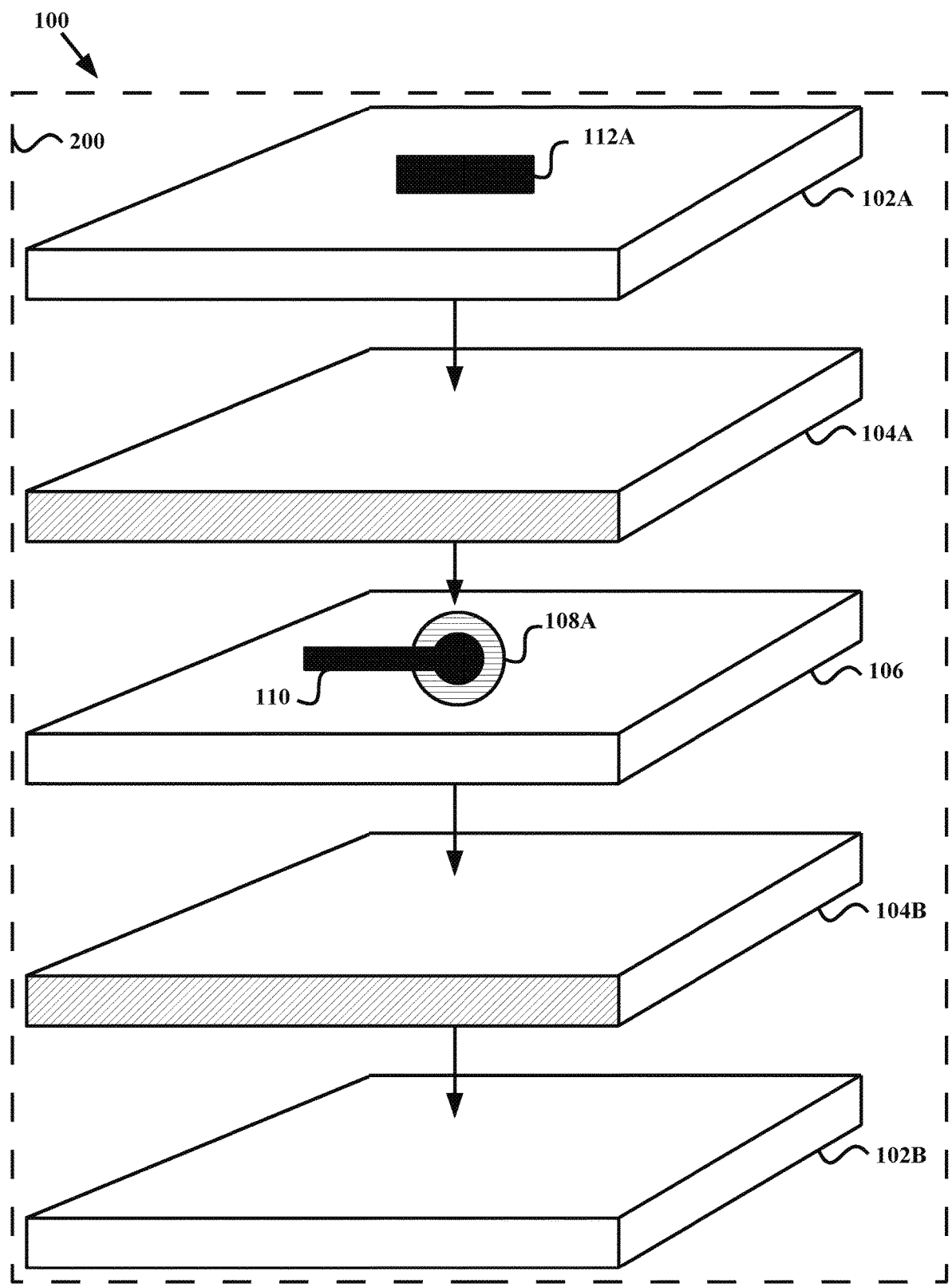
FIG. 1 depicts an exploded view of a lamination process of a printed wiring board, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of printed wiring boards (PWB), which are sometimes referred to as printed circuit boards, and more specifically to eliminating via stubs in plated through holes by disrupting plating using personalized cores. While the present disclosure is not necessarily limited to such applications, various aspects of the disclosure may be appreciated through a discussion of various examples using this context.

Example embodiments will now be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper," "lower," "right," "left," "vertical," "horizontal," "top," "bottom," and derivatives thereof shall relate to the disclosed structures and methods, as oriented in the drawing figures. Terms such as "above," "overlying," "atop," "on top," "positioned on," or "positioned atop" mean that a first element, such as a first structure, is present on a second element, such as a second structure, wherein intervening elements, such as an interface structure, may be present between the first element and the second element. The term "direct contact" means that a first element, such as a first structure, and a second element, such as a second structure, are connected without any intermediary conducting, insulating, or semiconductor layers at the interface of the two elements. The term substantially, or substantially similar, refers to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention. Additionally noted is that like reference numerals are used to designate like parts in the accompanying drawings.

Turning now to FIG. 1, illustrated is an exploded view of a lamination process of a printed wiring board (PWB) 100, in accordance with embodiments of the present disclosure. The PWB 100 is formed by a stack 200, which is generated by stacking multiple core layers (e.g., core 102A, core 102B, and circuitized core 106) with intervening prepreg (e.g., prepreg 104A and prepreg 104B) and then laminating the stack. A core layer may be a metal clad material where the material is integrated with a metal conductor pattern on one or both sides. The metal conductor material may be copper. Prepreg may be a fibrous reinforcement fabric impregnated with a resin binder (e.g., epoxy). Prepreg may additionally be referred to as a glass layer and/or a sticker sheet and is used as an adhesive to bond the cores 102A, 102B, and circuitized core 106 of the PWB 100.

The lamination process may begin with the core 102B acting as a bottom layer of the PWB 100. A bottom portion of the prepreg 104B is then placed and adhered to a top portion of the core 102B. A bottom portion of the circuitized core 106 is then placed and adhered to a top portion of the prepreg 104B. Next, a bottom portion of the prepreg 104A is then placed and adhered to a top portion of the circuitized core 106. The lamination process may end with a bottom portion of the core 102A placed and adhered to a top portion of the prepreg 104A, and laminating the stack 200 under conditions known to those skilled in the art. It is noted that the stack 200 is the entirety of the cores 102A and 102B, and the circuitized core 106 being placed and adhered to the prepreg 104A and 104B. In some embodiments, in order to adhere the prepreg 104A and 104B to the circuitized core 106, and the cores 102A and 102B, the prepreg 104A and 104B must respectively make direct contact with the circuitized core 106, and the cores 102A and 102B.

Figure 2:
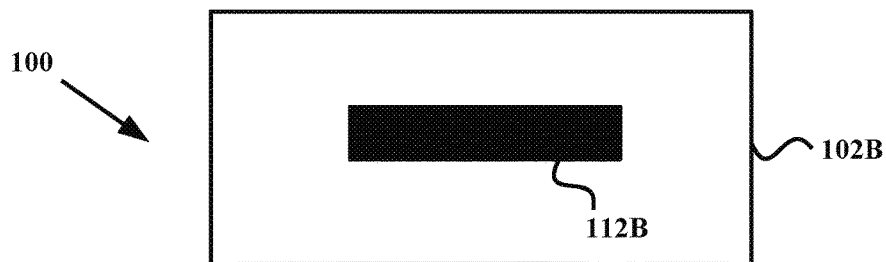
FIG. 2 depicts a bottom view of a printed wiring board, in accordance with embodiments of the present disclosure.

In some embodiments, the circuitized core 106 may be circuitized by including a photoresist and conductive channels. For proposes of this disclosure, the circuitized core 106 is circuitized by including a copper trace 110 on an internal plane of the circuitized core 106, which includes a bulb structure that indicates a drilling area. In some embodiments, the cores 102A and 102B may be circuitized. Core 102A includes a copper lamination 112A physically integrated (e.g., in direct contact) into a top portion of the core 102A. Core 102B, as depicted by FIG. 2, which illustrates a bottom view of the printed wiring board 100, includes a copper lamination 112B physically integrated into a bottom portion of the core 102B.

In some embodiments, the circuitized core 106 includes an anti-plate coating 108A. The anti-plate coating 108A is placed below the bulb structure of the copper trace 110 and has a diameter larger than the diameter of the bulb structure. The anti-plate coating 108A may be a 3-D printing or inkjet material, such as an acetal resin, polytetrafluoroethylene, photoresist, or ink. The anti-plate coating 108A will not allow a seed material to adhere. The anti-plate coating 108A may be any material that a seed material will not adhere to and may change depending on the type of seed material used. In some embodiments, the PWB 100 may need to be textured or printed (e.g., 3-D printed) with a rough surface to enable adhesion to the prepreg 102A and 102B.

Figure 3A:
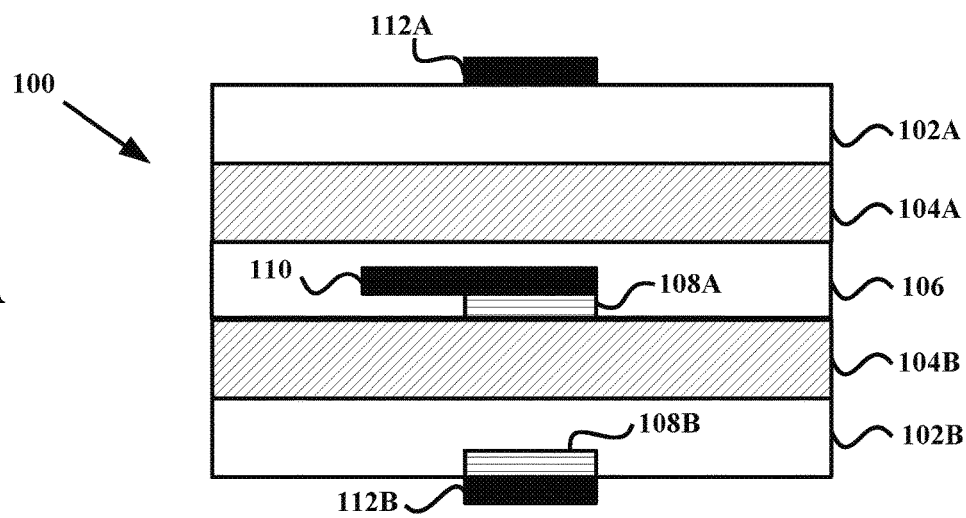
FIGS. 3A-F depict a core-view diagram of a process for eliminating via stub formation in the printed wiring board, in accordance with embodiments of the present disclosure.

Referring now to FIGS. 3A-F, depicted is a core-view diagram of a process for eliminating via stub formation in the PWB 100, in accordance with embodiments of the present disclosure. FIG. 3A depicts the PWB 100 after the lamination processes, where the circuitized core 106, and the core layers 102A and 102B are adhered to their respective portions of the prepreg 102A and 102B. From the core-view of the PWB 100, it is noted that anti-plate coating 108A is injected below the copper trace 110 and that anti-plate coating 108B is injected above the copper lamination 112B. Anti-plate coating 108B may be a 3-D printing or inkjet material, such as an acetal resin, polytetrafluoroethylene, photoresist, or ink, such that the anti-plate coating 108B will not allow a seed material to adhere. The anti-plate coating 108B may be any material that a seed material will not adhere to and may change depending on the type of seed material used. Anti-plate coating 108B may have the same physical dimensions (e.g., shape, diameter) as the anti-plate coating 108A. The anti-plate coatings 108A and 108B may respectively be injected into the core layers 102A and 102B using a 3-D printer or an inkjet printer. The anti-plate coating 108B may be injected into the bottom surface of the core layer 102B in order to electrically isolated the via 150.

The copper laminations 112A, 112B, the bulb structure of the copper trace 110, and the anti-plate coatings 108A, 108B are vertically aligned in a through hole path. A top portion of the anti-plate coating 108A is adhered and directly contacted to a bottom portion of the bulb structure of the copper trace 110. A bottom portion of the anti-plate coating 108A is adhered and directly contacted to the top layer of the prepreg 104B. A bottom portion of the anti-plate coating 108B is adhered and directly contacted to a top layer of the copper lamination 112B.

Figure 3B:
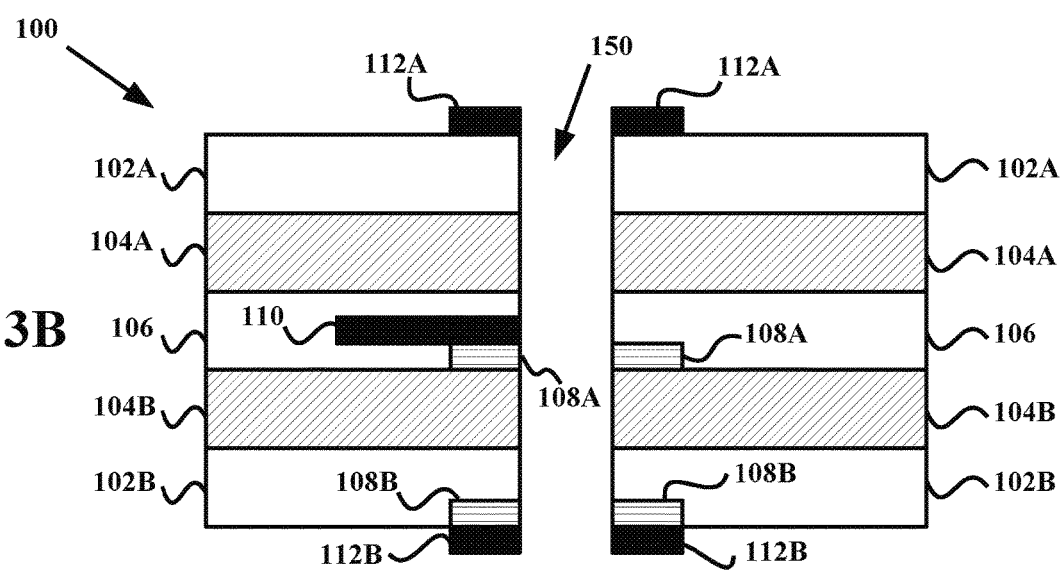
Figure 4:
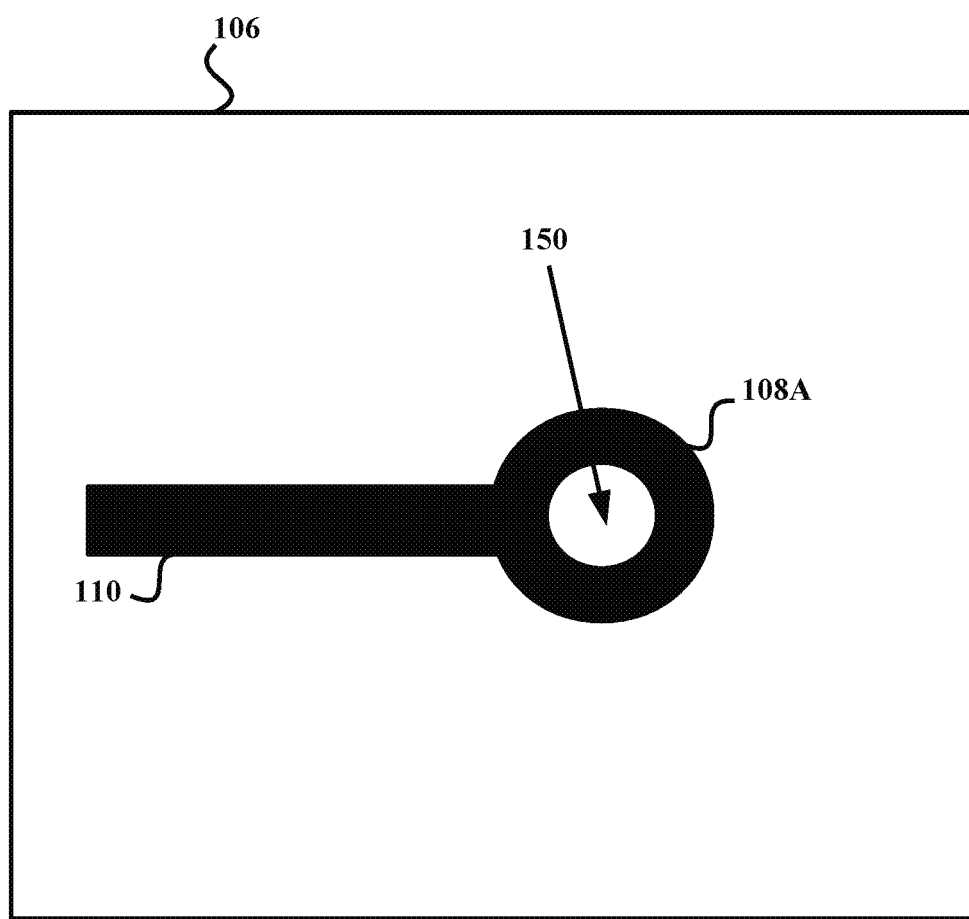
FIG. 4 depicts a top-view of a circuitized core with a via, in accordance with embodiments of the present disclosure.

In some embodiments, a via 150 may be formed by laser drilling and/or mechanical drilling, as depicted in FIG. 3B. The via 150 is formed by drilling the PWB 100 on the through hole path. For illustrative purposes, the via 150 is portrayed as a hole that splits the PWB 100 equally (e.g., in all directions) into two halves, however, it is noted that the via 150 is actually a hole that runs through a portion of the PWB 100 and is not a cut that splits the PWB 100 into two pieces. In regard to FIG. 4, a top-view of the circuitized core 106 with the via 150 is depicted. The via 150 is drilled with a bit that is larger than the size of the bulb structure and completely removes the bulb structure, leaving a jutted portion of the copper trace 110 and a circumference of the anti-plate coating 108A. The via 150 has a consistent circumference throughout the components of the PWB 150. Upon drilling and forming the via 150, the anti-plate coating 108A and 108B is exposed below the signal plane that requires connection to the via (e.g., from the copper lamination 112A to the copper trace 110).

Figure 3C:
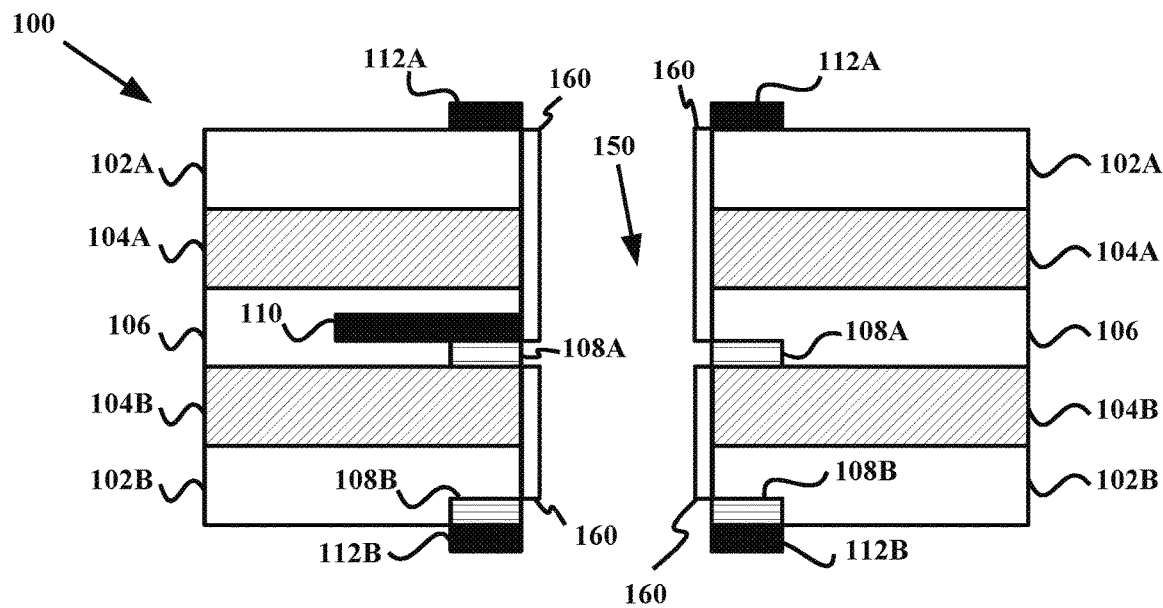

After forming the via 150, a seed material is added, from a top portion of the PWB 100, to the via 150. The seed material adheres to the inner portions of the via 150, generating the seed layer 160, as depicted in FIG. 3C. Seed layer 160 adheres to inner portions of the via 150, which is comprised of the portions of circuitized core 106, core layers 102A, 102B, and prepreg 104A, 104B. Additionally, the seed layer 160 adheres to an outer portion of the jutted portion of the copper trace 110 that is exposed in via 150. The seed material does not adhere to the anti-plate coatings 108A and 108B or the copper laminations 112A and 112B (as these are masked off in the seed process). The seed material will allow electroless materials (e.g., electroless metals) to adhere to exposed portions of the seed layer, the exposed portions being substantially directed towards the inside of the via 150.

Figure 3D:
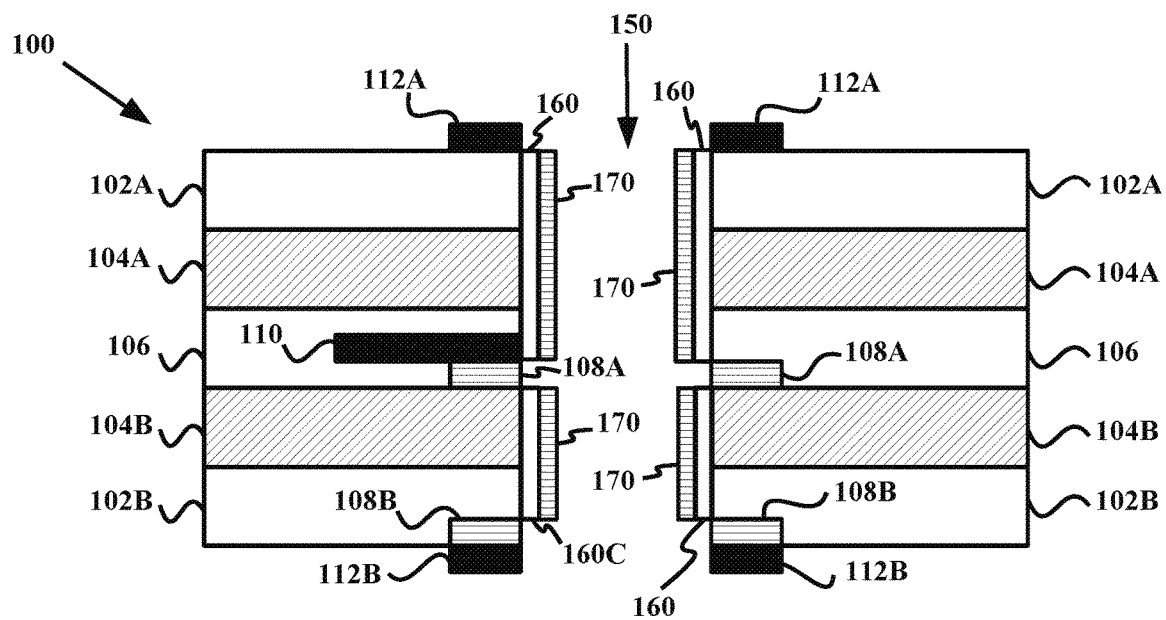

After adhering the seed material and forming the seed layer 160, an electroless metal is added, from the top portion of the PWB 100, to the via 150. The electroless metal may be electroless copper. The electroless metal adheres to the seed layer 160, generating the electroless plate layer 170, as depicted in FIG. 3D. The electroless plating does not adhere to the anti-plate coatings 108A and 108B or the copper laminations 112A and 112B.

Figure 3E:
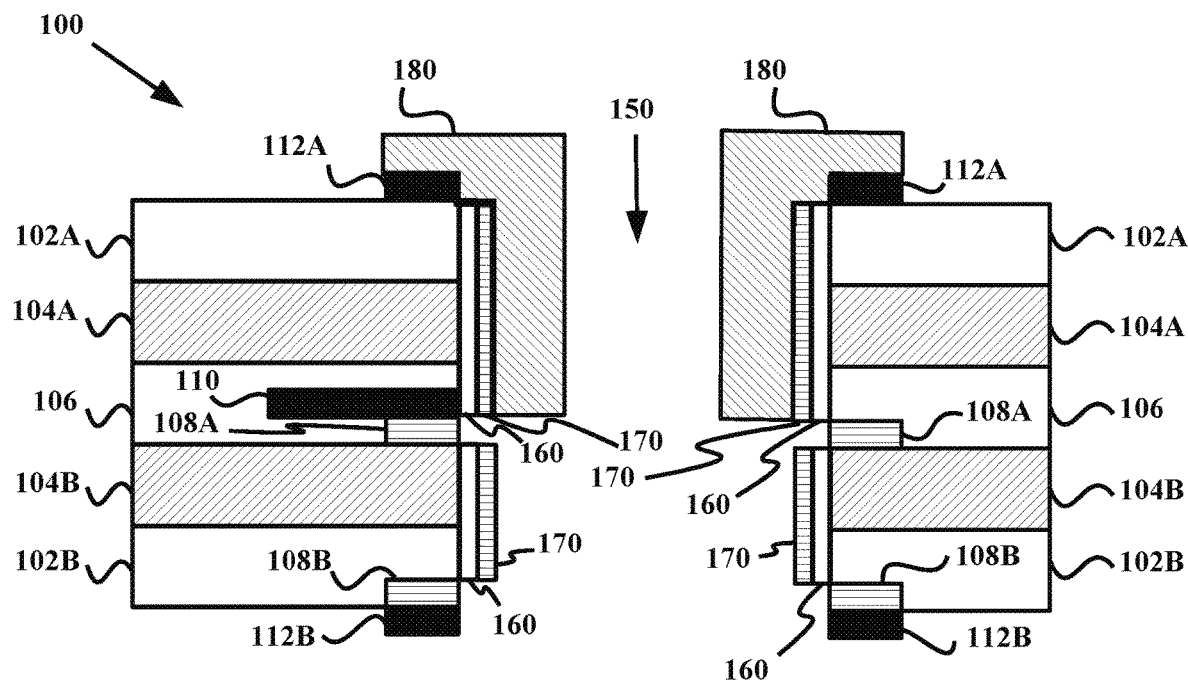

After adhering the seed material and forming the electroless plate layer 170, electrolytic copper is added, from the top portion of the PWB 100, to the via 150. The electrolytic copper adheres to the electroless plate layer 170, generating the copper layer 180, as depicted in FIG. 3E. The electrolytic copper does not adhere to the anti-plate coatings 108A and 108B, but does adhere to the copper lamination 112A, forming a capture pad on the PWB 100. The electrolytic copper adheres to the copper lamination 112A because the copper lamination 112A is on the top portion of the core layer 102A where the electrolytic copper is initially added. Additionally, because of the anti-plate coating, the electrolytic copper does not adhere to a portion of the electroless plate layer 170 that is between the anti-plate coatings 108A and 108B.

Figure 3F:
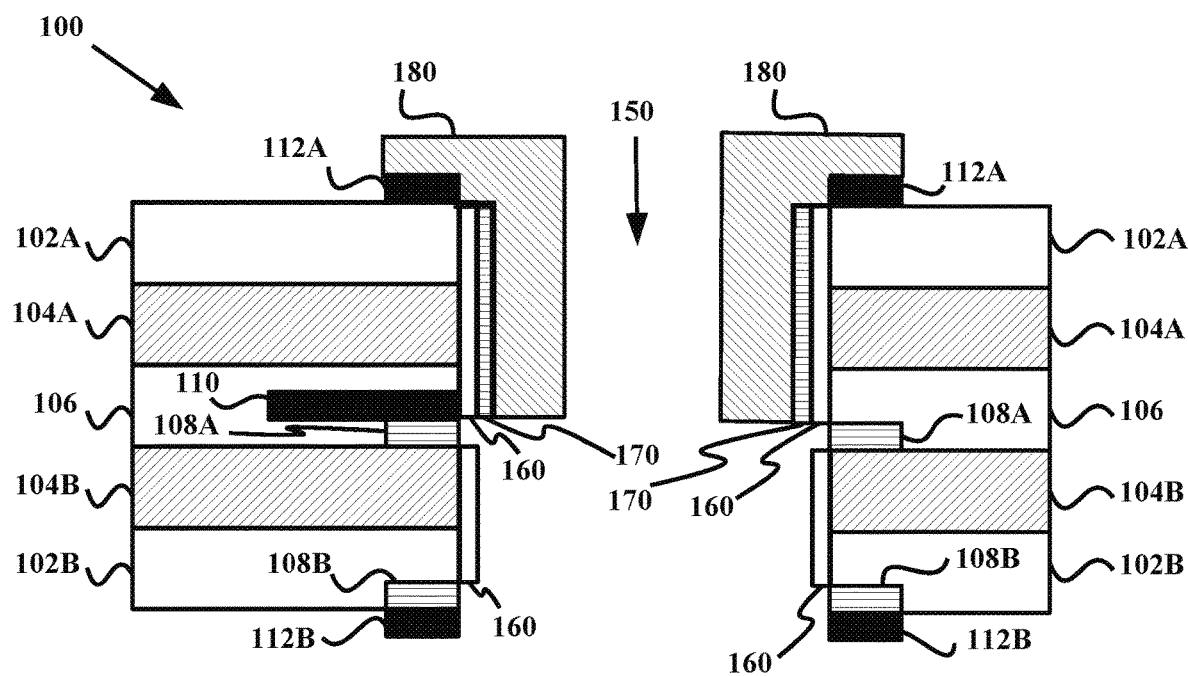

After adhering the electrolytic copper and forming the copper layer 180, light etching is performed, from the top portion of the PWB 100, to the via 150. The light etching removes the electroless plate layer 170 that is between the anti-plate coatings 108A and 108B, as depicted in FIG. 3F. It is understood that light etching is performed by any means commonly known by a person having ordinary skill in the art. Additionally, it is noted that the light etching does not remove the electroless plate layer 170 between the anti-plate coating 108A and the top portion of the core layer 102A because the copper layer 180 prevents the light etching from removing the electroless plate layer 170 between the anti-plate coating 108A and the top portion of the core layer 102A.

The benefits of depositing the anti-plate coatings 108A and 108B are to eliminate or greatly reduce via stub formation in the via 150 (e.g., plated through hole), include significantly decreasing production costs associated with the PWB 100, and increasing signal integrity of digital signals passing through the via 150. If conventional methods were used in the formation of the via 150, a via stub would have formed that would significantly distort signals that pass through the via 150. The via stub would have to be removed or reduced by conventional means such as backdrilling, or by use of micro via or build up layer processing techniques.

Unfortunately, backdrilling is a costly, time-consuming process that uses controlled depth drilling techniques to remove the via stub (e.g., remove conductive plating in a via stub region). Additionally, micro via and/or build up layer processing techniques add numerous processing steps to form short vias. The addition of processing steps can cause significant yield impact, resulting in large cost increases. Thus, the construction of a PWB with anti-plate coating that is injected into core layers by a 3-D printer or inkjet printer, which subsequently prevents the formation or reduces the formation of a via stub, is a preferred alternative to the conventional methods.

Figure 5:
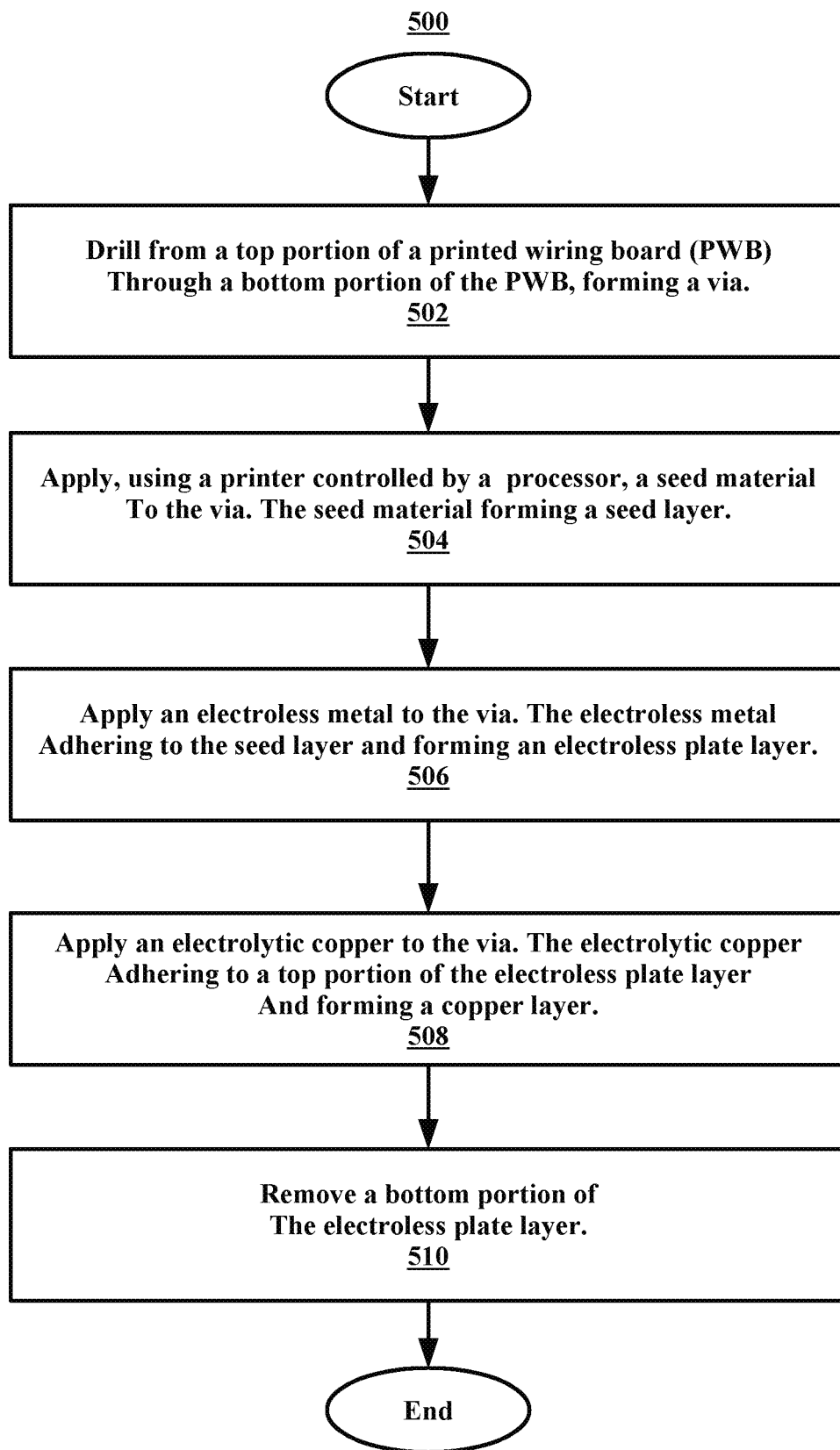
FIG. 5 illustrates a flowchart of an example method for forming a stubless via in a printed wiring board, in accordance with embodiments of the present disclosure.

Referring now to FIG. 5, illustrated is a flowchart of an example method 500 for forming a stubless via in a printed wiring board (PWB), in accordance with embodiments of the present disclosure. In some embodiments, the method 500 may begin at operation 502 where a PWB is drilled (e.g., using a CNC mill, a laser mill, etc.) from a top portion of the PWB through a bottom portion of the PWB. The drilling forming a via. In some embodiments, the PWB includes one or more prepreg layers alternatively stacked between two or more core layers. At least one core layer is circuitized with a copper trace and at least two core layers include anti-plate coatings. The via may expose one or more internal portions of the core layers, the prepreg layers, and the anti-late coatings.

After operation 502, the method 500 may proceed to operation 504, where using a printer (e.g., a 3-D printer) controlled by a processor, a seed material may be applied (e.g., injected) to the via. The seed material forming a seed layer within the via. The seed material may form a seed layer by adhering to the exposed internal portions of the core layers and the prepreg layers, but not adhering to the exposed internal portions of the anti-plate coatings.

After operation 504, the method 500 may proceed to operation 506, where an electroless metal may be applied (e.g., by the printer) to the via. In some embodiments, the electroless metal forms an electroless plate layer by adhering to the seed layer. Following operation 506, the method 500 may proceed to operation 508.

At operation 508, electrolytic copper may be applied (e.g., by the printer) to the via. The electrolytic copper forming a copper layer by adhering to a top portion of the electroless plate layer and not adhering to a bottom portion of the electroless plate layer. After operation 508, the method 500 may proceed to operation 510, where the bottom portion of the electroless plate layer is removed. In some embodiments, the bottom portion of the electroless plate layer is removed using light etching. After operation 510, the method 500 may end.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method for forming a stubless via in a printed wiring board (PWB) comprising:
    drilling, from a top portion of the PWB through a bottom portion of the PWB, the PWB including one or more prepreg layers alternatively stacked between two or more core layers, wherein at least one core layer is circuitized with a copper trace, and at least two core layers include anti-plate coatings, and wherein the drilling forms a via, the via exposing one or more internal portions of the core layers, the prepreg layers, and the anti-plate coatings;
    applying, from the top portion of the PWB, a seed material to the via, wherein the seed material forms a seed layer by adhering to the exposed internal portions of the core layers and the prepreg layers, and wherein the seed material does not adhere to the exposed internal portions of the anti-plate coatings;
    applying, from the top portion of the PWB, an electroless metal, wherein the electroless metal forms an electroless plate layer by adhering to the seed layer;

applying, from the top portion of the PWB, electrolytic copper, wherein the electrolytic copper forms a copper layer by adhering to a top portion of the electroless plate layer and not adhering to a bottom portion of the electroless plate layer; and removing the bottom portion of the electroless plate layer.

2. The method of claim 1, wherein the top portion of the PWB and the bottom portion of the PWB are core layers.

3. The method of claim 2, the top portion of the PWB includes a first copper lamination and the bottom portion of the PWB includes a second copper lamination, wherein the first and second copper laminations are respectively physically integrated into each of the core layers.

4. The method of claim 3, wherein the copper layer further adheres to the first copper lamination, forming a capture pad.

5. The method of claim 4, wherein the copper trace includes a jutted portion and a bulb portion.

6. The method of claim 5, wherein the first copper lamination, the bulb portion of the copper trace, the anti-plate coatings, and the second copper lamination are vertically aligned in a through hole path.

7. The method of claim 6, wherein the via is formed from drilling on the through hole path.

8. The method of claim 1, wherein the anti-plate coatings are acetal resins.

9. The method of claim 8, wherein the anti-plate coatings are injected into an internal plane of at least one core layer and at least one circuitized core layer.

10. The method of claim 9, wherein the anti-plate coatings are injected using a 3-D printer.

11. The method of claim 9, wherein the anti-plate coatings are injected using an inkjet printer.

\* \* \* \* \*